United States Patent [19]
Katsui et al.

[11] Patent Number: 5,629,560
[45] Date of Patent: May 13, 1997

[54] INTEGRATED CIRCUIT PACKAGE

[75] Inventors: Tadashi Katsui; Katsuhiko Nakata, both of Kawasaki; Takashi Kitahara, Kahoku-gun, all of Japan

[73] Assignees: Fujitsu Ltd, Kawasaki; PFU Limited, Ishikawa, both of Japan

[21] Appl. No.: 468,187

[22] Filed: Jun. 6, 1995

Related U.S. Application Data

[63] Continuation of Ser. No. 120,358, Sep. 14, 1993, abandoned.

[30]  Foreign Application Priority Data

Mar. 19, 1993 [JP] Japan .................................. 5-060005

[51] Int. Cl.$^6$ .................................................. H01L 23/34
[52] U.S. Cl. .................. 257/712; 257/721; 257/722
[58] Field of Search .................................... 257/722, 714, 257/712, 713, 721

[56]  References Cited

U.S. PATENT DOCUMENTS 5,132,780  7/1992  Higgins, III ........................ 257/722
5,198,889  3/1993  Hisano et al. ........................ 257/714

FOREIGN PATENT DOCUMENTS 0285779  10/1988  European Pat. Off. .
89/00751  1/1989  European Pat. Off. .
94/04013  2/1994  Japan .

OTHER PUBLICATIONS

IBM Technical Disclosure Bulletin, vol. 34, No. 7B, Dec. 1991, pp.321–322.

*Primary Examiner*—Sara W. Crane
*Assistant Examiner*—Roy Potter

[57]  ABSTRACT

The integrated circuit package includes a package body, an integrated circuit chip enclosed airtight in the package body, a lead provided at a lower portion of the package body for connecting the integrated circuit chip to an external circuit, and air blasting means for cooling the package body by forced air cooling. The package body has, at an upper portion thereof, a heat radiation region formed from a fin and an air blasting region in which the air blasting means is disposed. A ventilation flue is formed between the heat radiation region and the air blasting region. This package is particularly superior in its heat radiation properties.

12 Claims, 4 Drawing Sheets

INTEGRATED CIRCUIT PACKAGE

This application is a continuation of application Ser. No. 08/120,358, filed Sep. 14, 1993, now abandoned.

BACKGROUND OF THE INVENTION

1. Field of the Invention

This invention relates generally to an integrated circuit package wherein an integrated circuit chip is enclosed in an airtight package body, and more particularly to improvements in heat radiation characteristic of an integrated circuit package.

2. Description of the Related Art

In recent years, portable electronic apparatus such as, for example, lap-top personal computers have widely appeared on the market as electronic apparatuses for which miniaturization and high reliability are required. In order to achieve high performance of electronic apparatuses of the type just mentioned, it is necessary to use one or more integrated circuit chips thereby resulting in a great amount of heat generation. Therefore, integrated circuit packages that have a high heat radiation property are needed.

Conventionally, a technique for improving the heat radiation property of an integrated circuit package included the practice of closely contacting an integrated circuit package with a heat sink structure which is a separate body from the integrated circuit package in order to enhance the heat radiation property of the integrated circuit. However, where a prior art installation employ a heat sink adopted, not, a large amount of resistance arising from contact between an integrated circuit package and a heat sink results. Accordingly, such prior art installation results in a limitation in the improvement in heat radiation properties of an integrated circuit package.

SUMMARY OF THE INVENTION

Accordingly, it is an object of the present invention to provide an integrated circuit package which is particularly superior in its heat radiation property.

FIG. 1 is a view showing a basic construction of an integrated circuit package of the present invention.

In accordance with the present invention, there is provided an integrated circuit package which comprises a package body 1, an integrated circuit chip 2 enclosed in an airtight fashion in the package body 1, a lead 3 provided at a lower portion of the package body 1 for connecting the integrated circuit chip 2 to an external circuit, and air blasting means for cooling the package body 1 by forced air cooling, and wherein the package body 1 has, at an upper portion thereof, a heat radiation region 6 formed from a fin 5 and an air blasting region 7 in which the air blasting means is disposed, and a ventilation flue 8 is formed between the heat radiation region 6 and the air blasting region 7.

FIG. 2 is a view for explaining the prior art in contrast with the integrated circuit package of the basic construction of the present invention shown in FIG. 1, and there is shown an integrated circuit package which comprises a package body 11, an integrated circuit chip 2 enclosed in an airtight fashion in the package body 11, and a lead 3 provided at a lower fashion portion of the package body 1 for connecting the integrated circuit chip 2 to an external circuit, an upper face of the integrated circuit package being adhered to a lower face of the heat sink 12. Under certain circumstances, the heat sink 12 has means for forced air cooling such as a fan.

FIG. 3 is an equivalent circuit diagram of heat radiation of the prior art of FIG. 2. Reference character Tj denotes a junction temperature (°C.) of the integrated circuit chip 2, Rjc heat resistance (°C./W) from the junction of the integrated circuit chip 2 to the surface of the package body 11, Rc heat resistance (°C./W) at a contact portion between the package body 11 and the heat sink 12, Rhf heat resistance (°C./W) of the heat sink 12, Rfa heat resistance (°C./W) between the heat sink and the air, and Ta an ambient temperature (°C.).

In this instance, if the amount (W) of heat generation of the integrated circuit chip 2 is represented by P, then the junction temperature Tj of the integrated circuit chip 2 is represented by the following equation.

$$Tj=P(Rjc+Rc+Rhf+Rfa)+Ta$$

Accordingly, if the junction temperature of the integrated circuit chip 2 when the ambient temperature is equal is compared between the basic construction of the present invention and the prior art of FIG. 2, then it can be seen that the prior art example is higher by a temperature provided by the product (Rc·P) between the heat resistance at the contact portion and the heat generation amount. The heat resistance Rc at the contact portion generally is 0.3° to 0.5° C./W or so, and when the heat generation amount of the integrated circuit chip is 20 W, the junction temperature is higher in the prior art example by 6° to 10° C. While it has been a conventional practice to use heat conductive grease or a special bonding agent at a contact portion between a package body and a heat sink, there is a limitation in reduction of the heat resistance at the contact portion by them. Meanwhile, it is said that the reliability of an integrated circuit chip is reduced to one half each time the junction temperature rises 10° C.

Accordingly, to provide the heat radiation region 6 on the package body 1 itself as in the present invention is very effective in order to lower the junction temperature to enhance the reliability of the integrated circuit chip. Further, in the present invention, since the air blasting region 7 is provided at the upper portion of the package body 1 and the fin 5 and so forth in the heat radiation region 6 are cooled by forced air cooling by way of the ventilation flue 8 by the air blasting means disposed in the air blasting region 7, effective heat radiation for the integrated circuit chip 2 becomes possible, and the heat radiation property of the integrated circuit is improved remarkably.

The above and other objects, features and advantages of the present invention and the manner of realizing them will become more apparent, and the invention itself will be best understood from a study of the following description and appended claims with reference to the attached drawings showing some preferred embodiments of the invention.

BRIEF DESCRIPTION OF THE DRAWINGS

The present invention is described with reference to the appended drawing figures, of which.

DESCRIPTION OF THE PREFERRED EMBODIMENTS

In the following, embodiments of the present invention will be described in detail with reference to the accompanying drawings. Like parts will be referenced to with the like numerals.

Figure 1:
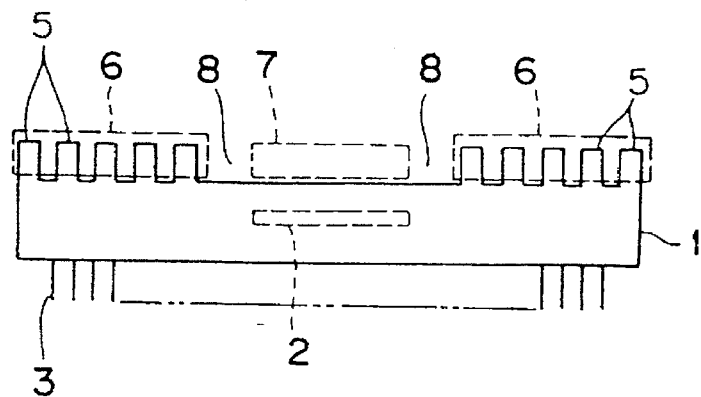
FIG. 1 is a view showing a basic construction of an integrated circuit package of the present invention.
Figure 2:
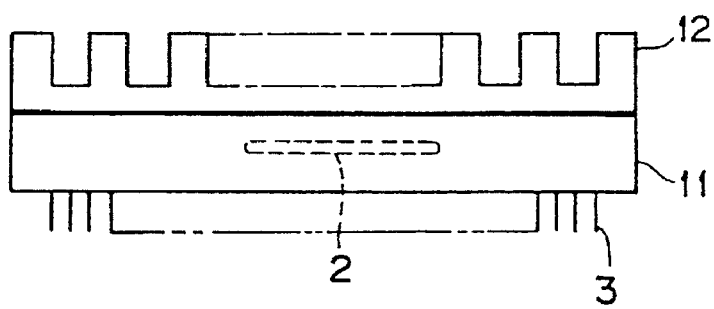
FIG. 2 is an explanatory view of the prior art.
Figure 3:
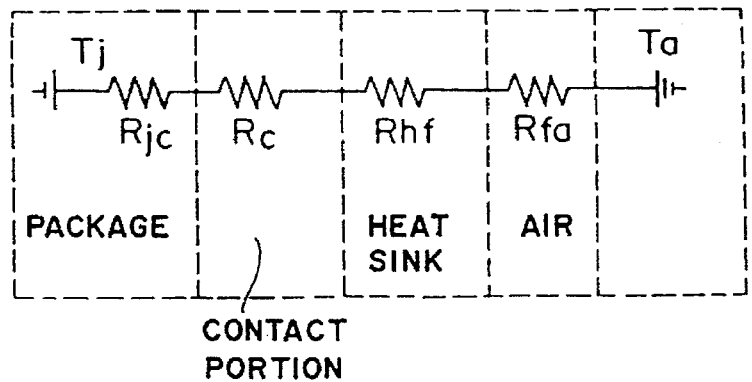
FIG. 3 is an equivalent circuit diagram of heat radiation characteristics of the structure depicted in FIG. 2.
Figure 4:
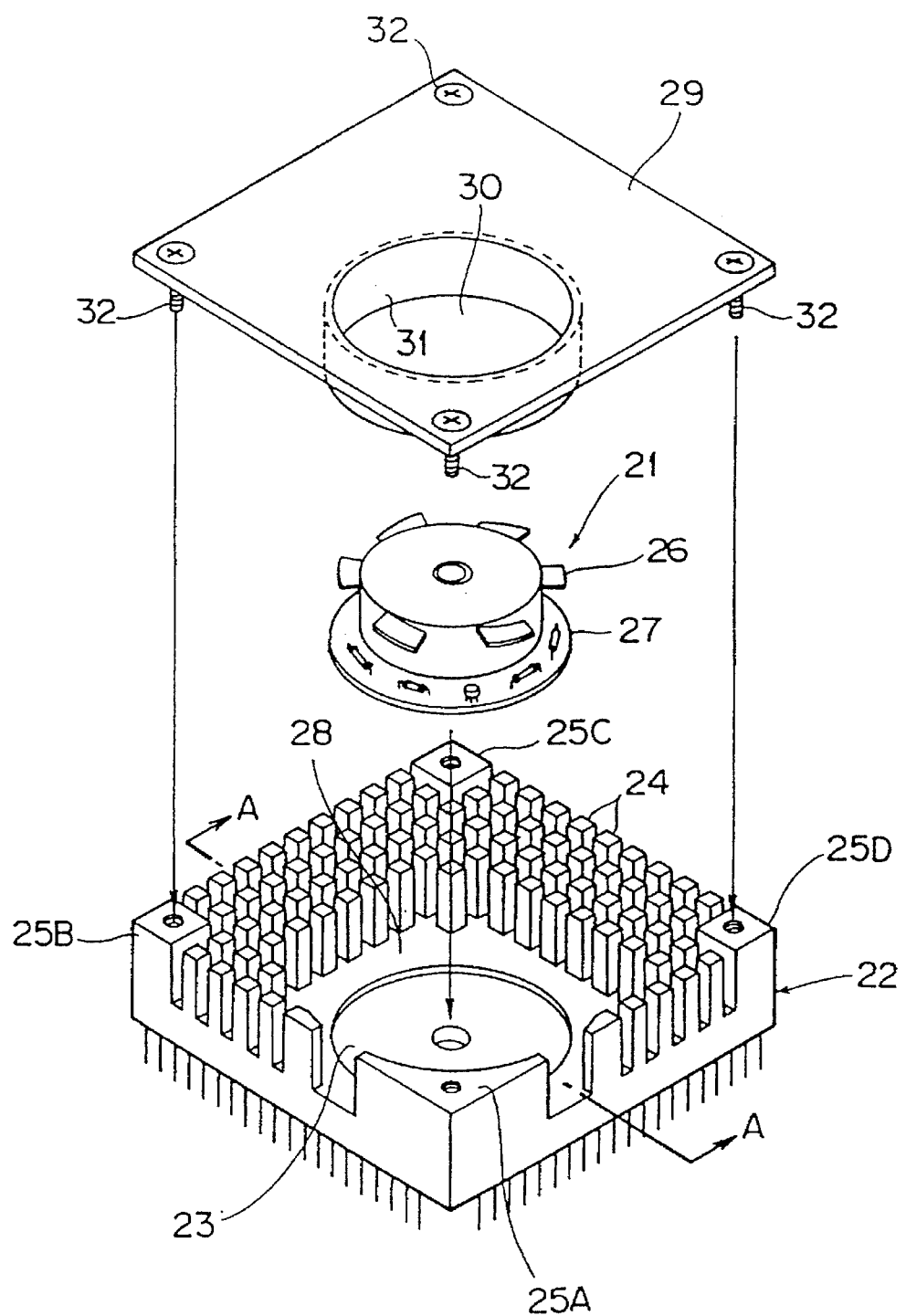
FIG. 4 is an exploded perspective view of an integrated circuit package showing a first embodiment of the present invention.

Referring now to FIG. 4, therein depicted is an exploded perspective view of an integrated circuit package showing a first embodiment of the present invention. In the present embodiment, a fan assembly 21 acts as air blasting means secured to a mounting portion 23 at an upper portion of a package body 22 to form an air blasting region. The package body 22 is formed in a substantially square shape (as viewed in plan) and has a plurality of pin-like heat radiation fins 24 provided uprightly in such a manner as to surround the mounting portion 23, and support posts 25A, 25B, 25C and 25D provided in an upright manner at the four corner portions. The fan assembly 21 is constituted from a motor (not shown) having a rotary shaft in a thicknesswise direction of the package body 22, a propeller 26 connected to the rotary shaft of the motor, and a driver circuit section 27 for driving the motor, and details of it will be described in connection with another embodiment wherein a fan assembly is secured to a cover. A ventilation flue 28 is formed between the fan assembly 21 provided on the mounting portion 23 (air blasting region) of the package body 22 and the heat radiation fins 24 (heat radiation region).

In the present embodiment, an upper portion of the package body 22 is closed up with a cover 29 in order to effect blasting of air by the fan assembly 21 efficiently. The cover 29 is a plate-formed member having a substantially same shape as the shape of the package body 22 as viewed in plan and has an opening 30 which communicates with the ventilation flue 28 by way of the propeller 26 of the fan assembly 21. Further, the cover 29 has an annular projection 31 positioned on a little outer side of a locus of rotation of the propeller 26, and the annular projection 31 limits the ventilation flue 28 so that the static pressure difference between the opening 30 of the cover 29 and the ventilation flue 28 may be great. The cover 29 is secured, at four corner portions thereof, to the support posts 25A, 25B, 25C and 25D of the package body 22 by way of screws 32. The cover 29 may be secured to the package body 22 by some other means than screws and is not so limited.

Figure 5:
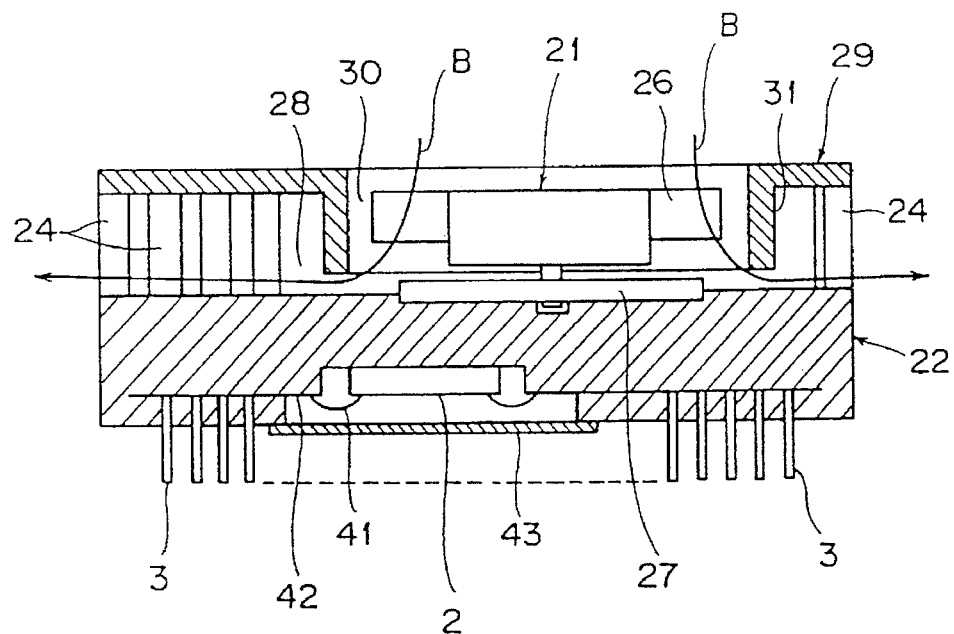
FIG. 5 is a sectional view of the integrated circuit package of the first embodiment of the present invention as depicted in FIG. 4.

Referring now to FIG. 5, therein depicted is a sectional view of the integrated circuit package of the first embodiment of the present invention. The position of the section is taken along line A—A of the exploded perspective view of FIG. 4. In the present embodiment, the package body 22 is formed from a ceramic body such as alumina, and the fins 24 and so forth are molded integrally upon sintering of the ceramic body. The integrated circuit chip 2 is securely mounted on a recessed portion on the rear face side of the package body 22 and is connected to the leads 3 by way of bonding wires 41 and conductor patterns 42. A lid 43 is provided on the rear face side of the package body 22 so that the integrated circuit chip 2 is enclosed in an airtight manner.

If power is supplied to the fan assembly 21 by way of leads (not shown) to rotate the propeller 26 in a predetermined direction, then air flows in the direction indicated by an arrow mark B by a comparatively great static pressure difference between the outside and the ventilation flue 28 which is caused by an action of the annular projection 31 of the cover 29. Then, good heat radiation is conducted at the heat radiation fins 24 and so forth by such circulation of the air. While, in the example shown, air flows from the opening 30 of the cover 29 through the ventilation flue 28 and further through the heat radiation fins 24 to sideward portions of the package body 22, the inclination angle of the propeller 26 may be reversed or the direction of rotation of the fan assembly 21 may be reversed so that air may flow in the direction opposite to the direction of the arrow mark B. In the present embodiment, since the cover 29 which covers over the upper portion of the package body 22 is provided and besides the annular projection 21 is adopted so as to increase the static pressure difference between the outside and the ventilation flue 28, even when the fan assembly 21 is small in size and low in power consumption, a sufficient heat radiation effect can be obtained.

In the present embodiment, the mounting portion 23 of the package body 22 which serves as an accommodation space for the fan assembly 21 is offset toward the direction of 25A of the four support posts 25A, 25B, 25C and 25D and a wall face of the support post 25A is elongated toward the directions of the support posts 25B and 25D (see FIG. 4). The reason why the center of the fan assembly 21 is offset from the center of heat generation of the package body 22 (see to the integrated circuit chip 2 of FIG. 5) is that the air blasting capacity of the fan assembly 21 is higher at a circumferential portion than at a central portion of the fan assembly 21 and it is intended to make the location where the air blasting capacity is high and the center of heat generation of the package body 22 substantially coincide with each other. Consequently, heat which is emitted directly by way of the upper face of the package body 22 from the integrated circuit chip 2 by way of the heat radiation fins 24 can be absorbed well by the circulating air. Further, since the fan assembly 21 is positioned at a position offset from the center of heat generation, a rise of the internal temperature of the fan assembly 21 is restricted, and the reliability of the fan assembly 21 is enhanced. It is to be noted that the reason why, when the fan assembly 21 is offset from the center of heat generation, the wall face of the support port 25A toward which it is offset is elongated is that it is intended to allow circulation of air to the heat radiation fins 24 to be performed equally.

Figure 6:
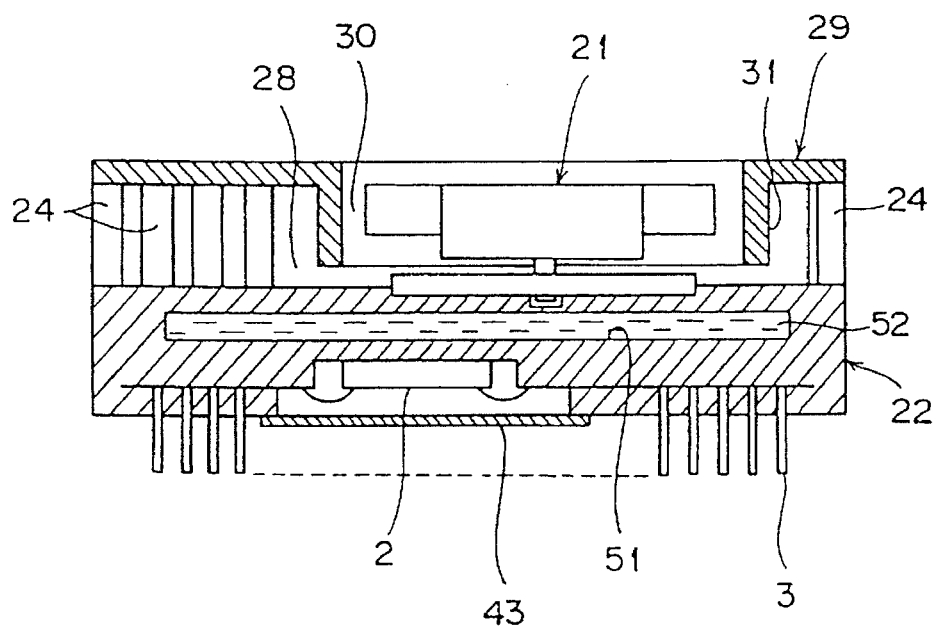
FIG. 6 is a sectional view of an integrated circuit package showing a second embodiment of the present invention.

Referring now to FIG. 6, therein depicted is a sectional view of an integrated circuit package showing a second embodiment of the present invention. The present embodiment is characterized, in contrast with the first embodiment of FIGS. 4 and 5, in that a hollow portion 51 is provided in a package body 22 just above an integrated circuit chip 2 and liquid 52 is filled in the hollow portion 51. Where such liquid filled structure is adopted, the heat resistance of the package body 22 itself is reduced by a convection action of the liquid. In short, heat generated by the integrated circuit chip 2 becomes liable to be transmitted to heat radiation fins 24, and the heat radiation effect can be further enhanced. A heat pipe may be embedded in the hollow portion 51 in place of the liquid 52 filled in the hollowing portion 51 of the package body 22. The heat pipe is constructed, for example, by decompressing the inside of an enclosed metal pipe having a capillary substance lined on an inner wall of it and enclosing a small amount of liquid in the inside of the enclosed metal pipe. Also by using such a heat pipe, the heat resistance of the package body 22 can be reduced so that heat transmission from the integrated circuit package 2 to the heat radiation fins 24 may be performed well.

Figure 7:
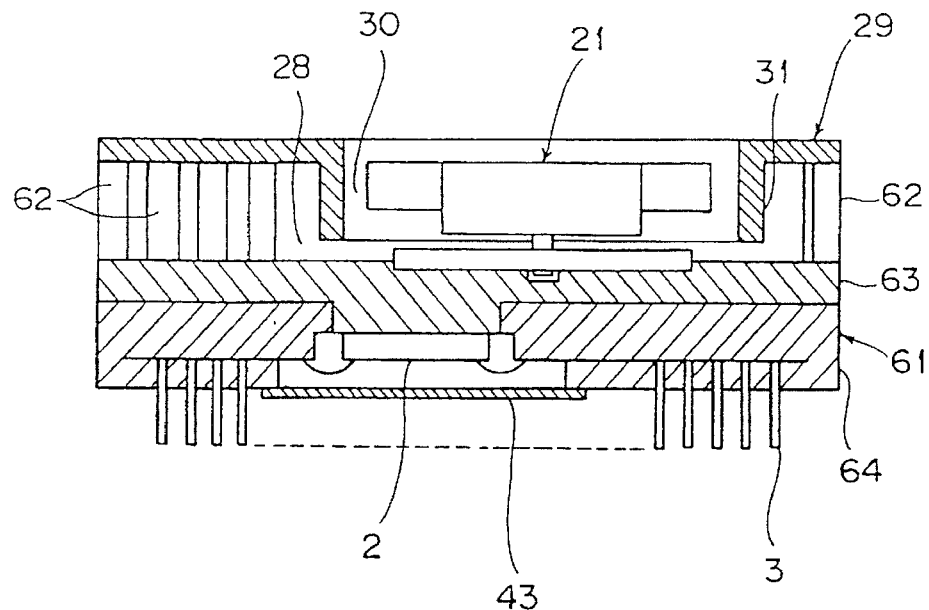
FIG. 7 is a sectional view of an integrated circuit package showing a third embodiment of the present invention.

Referring now to FIG. 7, therein depicted is a sectional view of an integrated circuit package showing a third embodiment of the present invention. The present embodiment is characterized, in contrast with the first embodiment of FIGS. 4 and 5, in that a package body 61 has a two-layer structure of a ceramic body and a metal body. The package body 61 is constructed by adhering a metal body 63 having heat radiation fins 62 and support posts (not shown) integrally at an upper portion thereof and having a convex portion at a lower portion thereof at which an integrated circuit chip 2 is securely mounted, and a ceramic body 64 having leads 3 provided at a lower portion thereof. For example, aluminum or copper which is high in heat conductivity is adopted as the material of the metal body 63. Since generally, the heat conductivity of a metal body is higher than that of a ceramic body, by securely mounting the integrated circuit chip 2 on the metal body 63 using the package body 61 of such a two-layer structure, heat transmission from the integrated circuit chip 2 to the heat radiation fins 62 can be further enhanced.

Figure 8:
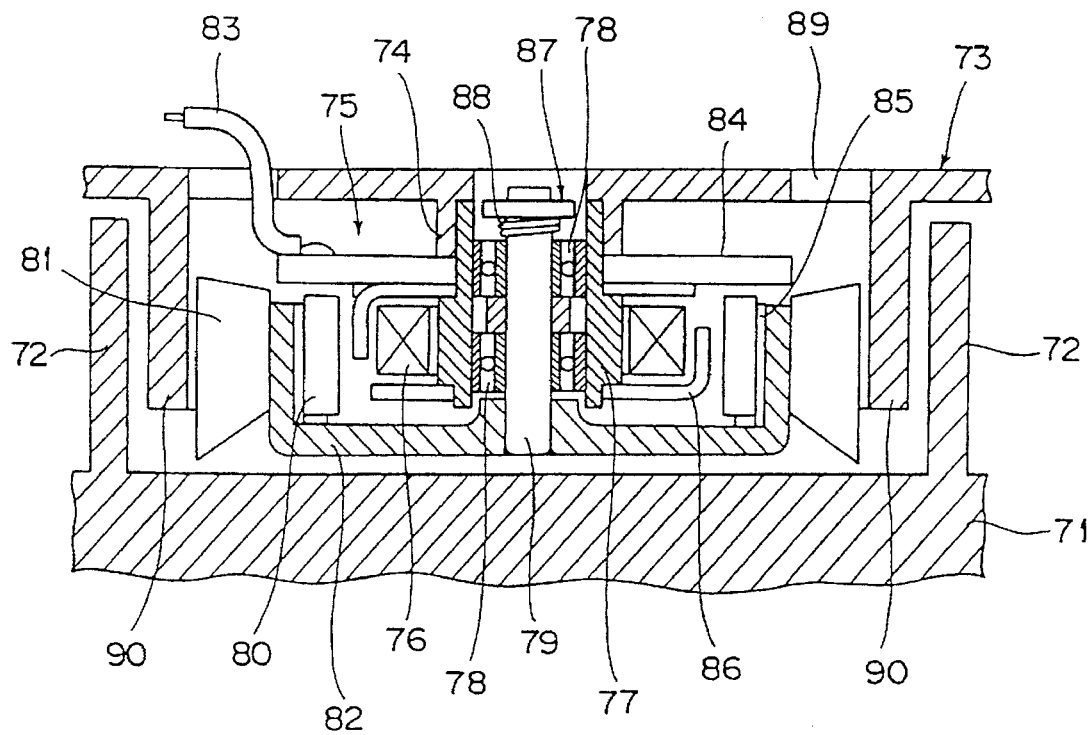
FIG. 8 is a partial sectional view of an integrated circuit package showing a fourth embodiment of the present invention.

Referring now to FIG. 8, therein depicted is a partial sectional view of an integrated circuit package showing a fourth embodiment of the present invention. While, in the embodiments described above, a fan assembly is secured to a package body, in the present embodiment, a fan assembly is secured to a cover so that heat from an integrated circuit chip may not be transmitted readily to the fan assembly. Referring to FIG. 8, reference numeral 71 denotes a package body, 72 is a heat radiation fin integral with the package body 71, and 73 is a cover for closing up an upper portion of the package body 71. A fan mounting portion 74 is formed on the rear face of the cover 73, and a fan assembly 75 is secured to the fan mounting portion 74. The fan assembly 75 is constituted from a stator 77 press-fitted in and/or secured to the fan mounting portion 74 and having a coil 76 provided on an outer peripheral portion thereof, a shaft 79 provided uprightly at the center of the stator 77 by way of a bearing 78, a rotor 82 secured to the shaft 79 and having a magnet 80 and a propeller 81 secured to an inner circumferential wall and an outer circumferential wall thereof, respectively, and a printed circuit board 84 to which a lead 83 is connected. A motor driver circuit not shown is mounted on the printed circuit board 84. It is to be noted that, in FIG. 8, reference numeral 85 denotes a ring yoke, 86 a yoke, 87 a cut washer mounted on the shaft 79, and 88 a spring for biasing the shaft 79 upwardly. Further, reference numeral 89 denotes an opening for air circulation provided in the cover 73, and 90 an annular projection for assuring a static pressure difference. The opening 89 is duplicated and contains a plural number of the same along a locus of rotation of the propeller 81.

According to the present embodiment, since the fan assembly 75 which acts as an air blasting means is secured to the cover 73, when compared with the case wherein the fan assembly is secured to the package body as in the first to third embodiments, heat generated from the integrated circuit chip is less liable to be transmitted to the fan assembly 75, and the reliability of the fan assembly 75 can be enhanced and the life of the fan assembly 75 can be elongated. Further, where the fan assembly is secured to the cover, since the mechanical strength for holding the fan assembly on the package body is not required, when the hollow portion 51 is formed in the package body 22 as in the second embodiment of FIG. 6, reduction in thickness of the package body can be achieved by securing the fan assembly to the cover.

As described so far, according to the present invention, there is an effect in that an integrated circuit package which is particularly superior in heat radiation property can be provided.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An integrated circuit package comprising:

a package body having a cover secured to it so as to close up the upper portion of said package body;

an integrated circuit chip enclosed airtight in said package body;

air blasting means for cooling said package body by forced air cooling, said air blasting means comprising a fan assembly secured to said cover of said package body;

said package body further having, at an upper portion thereof, a heat radiation region provided with a plurality of fins projecting from an upper surface of said package body, and an air blasting region in which said air blasting means is disposed, said upper surface being divided by said heat radiation region and said air blasting region; and a ventilation flue formed between said heat radiation region and said air blasting region of said package body.

2. An integrated circuit package comprising:

a package body;

an integrated circuit chip enclosed airtight in said package body;

air blasting means comprising a fan assembly for cooling said package body by forced air cooling;

said package body having, at an upper portion thereof, a heat radiation region provided with a plurality of fins projecting from an upper surface of said package body, and an air blasting region in which said air blasting means is disposed, said upper surface being divided by said heat radiation region and said air blasting region; and a ventilation flue formed between said heat radiation region and said air blasting region of said package body;

wherein the center of said fan assembly is offset from the center of heat generation of said package body.

3. The integrated circuit package according to claims 1 or 2, wherein said fan assembly includes a motor having a rotary shaft in a thicknesswise direction of said package body, a propeller connected to said rotary shaft of said motor, and a driver circuit section for driving said motor.

4. The integrated circuit package according to claims 1 or 2, wherein a hollow portion is provided between the upper portion of said package body and said integrated circuit chip; and wherein a liquid fills said hollow portion.

5. The integrated circuit package according to claims 1 or 2, wherein said package body is formed from a ceramic body, and said fin is integral with said ceramic body.

6. An integrated circuit package according to claims 1 or 2, wherein said package body has a two-layer structure of a ceramic body and a metal body, and said fin is integral with said metal body while said integrated circuit chip is securely mounted on said metal body.

7. The integral circuit package according to claims 1 or 2, wherein a hollow portion is provided between the upper portion of said package body and said integrated circuit chip; and wherein a heat pipe is embedded in said hollow portion.

8. The integrated circuit package according to claim 3, wherein said cover has an opening which communicates with said ventilation flue by way of said propeller.

9. The integrated circuit package according to claim 8, wherein said cover has an annular projection position on a little outer side of a locus of rotation of said propeller; and wherein the difference in static pressure between said opening of said cover and said ventilation flue is increased by said annular projection.

10. The integrated circuit package according to claim 9, wherein said propeller is rotated so that air may flow from said opening of said cover to the heat radiation portion of said package body through said ventilation flue.

11. The integrated circuit package according to claim 9, wherein said propeller is rotated so that air may flow from the heat radiated portion of said package body to said opening of said cover through said ventilation flue.

12. The integrated circuit package according to claim 2, wherein said fan assembly is secured to said package body.

* * * * *